US006528336B2

(12) United States Patent
Hosier et al.

(10) Patent No.: US 6,528,336 B2
(45) Date of Patent: Mar. 4, 2003

(54) METHOD FOR FABRICATION OF A SILICON PHOTOSENSOR ARRAY ON A WAFER AND TESTING THE SAME

(75) Inventors: Paul A. Hosier, Rochester, NY (US); Jagdish C. Tandon, Fairport, NY (US)

(73) Assignee: Xerox Corporation, Stamford, CT (US)

( * ) Notice: Subject to any disclaimer, the term of this patent is extended or adjusted under 35 U.S.C. 154(b) by 5 days.

(21) Appl. No.: 09/829,117

(22) Filed: Apr. 9, 2001

(65) Prior Publication Data

US 2003/0008423 A1 Jan. 9, 2003

Related U.S. Application Data

(60) Provisional application No. 60/206,350, filed on May 23, 2000.

(51) Int. Cl.[7] .............................................. H01L 21/66
(52) U.S. Cl. ............................ 438/17; 438/18; 438/43
(58) Field of Search ............................. 438/18, 14, 462, 438/17, 42, 43, 10, 11; 324/71.5, 719

(56) References Cited

U.S. PATENT DOCUMENTS

| 4,604,161 A | * | 8/1986 | Araghi | 438/68 |
| 4,814,296 A | | 3/1989 | Jedlicka et al. | 437/226 |
| 4,843,027 A | * | 6/1989 | Geekie | 438/10 |
| 5,219,796 A | | 6/1993 | Quinn et al. | 437/227 |
| 5,578,504 A | * | 11/1996 | Mitani et al. | 438/17 |
| 5,691,760 A | | 11/1997 | Hosier et al. | 347/238 |
| 6,159,386 A | * | 12/2000 | Wienand et al. | 438/55 |

* cited by examiner

Primary Examiner—Kevin M. Picardat
(74) Attorney, Agent, or Firm—Lloyd F. Bean, II

(57) ABSTRACT

A method of fabricating and a wafer having a plurality of photosensor Arrays thereon. And, a method of testing the wafer before the wafer is diced and assembled to form a Silicon photosensor Array which may be combined with other like photosensor arrays to form a full page width image sensor bar. The invention allows checking of every V-groove on every chip. An implanted or diffused region is placed across the V-groove, with electrical connections on both ends of the diffusion. If the V-groove is formed, the diffused region will be broken and the electrical path will be open. A deeper diffusion can be also used to check for incomplete V-grooves. If one end of the electrical path is tied to an existing I/O pad on the chip and the other end to ground, this path will have no effect on the input resistance if the V-groove is formed. There will be a small, but acceptable, increase in input capacitance. If the V-groove is not formed, the connection will appear as a short or high leakage on the chip input, which will fail the DC test on that I/O. Thus, existing DC tests can be used to check normal I/O integrity and V-groove process completion.

11 Claims, 6 Drawing Sheets

METHOD FOR FABRICATION OF A SILICON PHOTOSENSOR ARRAY ON A WAFER AND TESTING THE SAME

This application is based on a provisional application No. 60/206,350, filed May 23, 2000.

FIELD OF THE INVENTION

The present invention relates to photosensitive chips for creating electrical signals from an original image, as would be found, for example, in a digital scanner or facsimile machine. Specifically, the present invention relates to a guardring which is particularly useful in CMOS-based photosensor chips.

BACKGROUND OF THE INVENTION

In the context of document processing, a raster input scanner, or simply "scanner," is a device by which an image on a hard-copy original, such as a sheet of paper, is converted into digital data. A common design for a scanner includes a linear array of photosensitive elements, which form photosensors. Each photosensor in the array is adapted to output a signal, typically in the form of an electrical charge or voltage, of a magnitude proportional to or otherwise related to the intensity of light incident on the photosensor. By providing a linear array of these photosensors and causing the array to scan relative to the hard-copy original, each photosensor will output a sequence of charge signals resulting from the various gradations of dark and light in the image as the individual photosensors move through a path relative to the image.

In most low-cost scanners, such as presently found in inexpensive facsimile machines, the most typical technology for creating such a scanner is the charge-coupled device, or CCD. For higher-quality applications, an emergent technology is CMOS. Various patents related to using CMOS technology in a photosensor chip, such as used in a scanner, are assigned to the assignee hereof.

The number of photosensors that can be packed onto a single chip or wafer is limited, and this, in turn, limits the image resolution that can be achieved with a single photosensor array. Joining several of the smaller photosensor arrays together to form a longer array, and particularly, to form a full page width array with increased resolution along with the attendant simplification of the scanning system that this allows is desirable.

Photosensor arrays are formed from a plurality of generally rectangular substrates and are separated by sawing or other suitable means from one or more circular silicon wafers. Photosensor arrays may be assembled in the staggered relationship or butted end to end. If the arrays are placed end to end in a colinear fashion, the photodiodes and active circuitry needs to very close to the diced edge of the chip to prevent image quality problems.

One method presently employed to produce such photosensor arrays is the formation of aligned V-grooves in the wafer containing the semiconductive crystals so that after further processing the semiconductive crystals can be separated by dicing the wafer along the V-grooves. The V-grooves are structures that are etched along the 111 plane of the silicon, which is the easy slip plane for stress relief or cracks.

V-grooves are needed for proper dicing of the chips in regions very close to active circuits. If the V-groove is not there for each chip during dicing, chipping damage may occur and this will cause either a time "0" yield problem (meaning that a whole batch of fabricated diced wafers will be bad) or a reliability degradation problem in the final photosensor array. For more details, see U.S. Pat. Nos. 4,814,296 and 5,219,796 which are hereby incorporated by reference.

V-grooves are inspected in five locations on the wafer after processing. If the process is uniform across the wafer, these sample points are generally adequate. However, quite often the V-groove is not opened at all or is incomplete in random locations across the wafer, or in certain areas not covered by the sample locations. Only 100% visual inspection of all wafers catches all of these defects, or 100% inspection of a sample of wafers might indicate that there is a problem. Visual inspection of every chip on every wafer is labor intensive and prone to human error.

SUMMARY OF THE INVENTION

Briefly, the present invention obviates the problems noted above by utilizing a method for Fabrication of a Silicon photosensor Array on a wafer and testing the same. The invention allows checking of every V-groove on every chip. An implanted or diffused region is placed across the V-groove, with electrical connections on both ends of the diffusion. If the V-groove is formed the diffused region will be broken and the electrical path will be open. A deeper diffusion can be also used to check for incomplete V-grooves. If one end of the electrical path is tied to an existing I/O pad on the chip and the other end to the ground, this path will have no effect on the input resistance if the V-groove is formed. There will be a small, but acceptable, increase in input capacitance. If the V-groove is not formed, the connection will appear as a short or high leakage on the chip input, which will fail the DC test on that I/O. Thus, existing DC tests can be used to check normal I/O integrity and V-groove process completion.

There is provided a method for determining a condition of a V-groove on a wafer having a circuit structure thereon before the wafer is processed, cut and assembled, comprising the steps of: defining a V-groove region along the wafer; fabricating a circuit structure on the wafer; applying a test resistor along the V-groove region during said fabricating step; measuring a resistance value of said resistor after said fabricating step; comparing said resistance value to a predefined value to determine the condition of said V-groove.

BRIEF DESCRIPTION OF THE DRAWINGS

Other features of the present invention will become apparent as the following description proceeds and upon reference to the drawings, in which.

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

Figure 11:
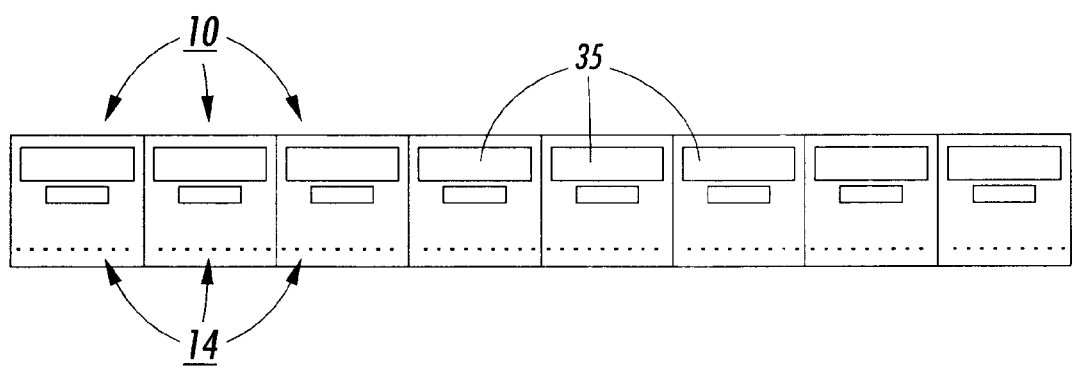
FIG. 11 is a view illustrating a plurality of photosensor chips butted together end to end to form a full width sensor bar.

Referring to FIG. 11, there is shown the solid-state full width sensor bar, designated generally by the numeral 10 (on drawing, the arrows for 10 should designate the whole set of sensor arrays), of the present invention. Sensor bar 10 has at least one linear array 12 of photosensors 14. In the exemplary arrangement described herein, sensor bar 10 is used to sense, either directly or through suitable lens means, images on a target document, through selective actuation of the individual photosensors 14 in the array 12 in accordance with an document reflectance from each pixel location on the document. For this purpose, sensor bar 10 has an overall length equal to or slightly greater than the effective width of the document. Ordinarily, sensor bar 10 is disposed at right angles to the direction of relative document movement and in predetermined spaced relation to the surface of the document as will be understood by those skilled in the art. As a result, sensor bar 10 senses the document a line at a time as the document, or sensor array, moves past to output a two dimensional array of image signal data representing the document. The image signal is then stored for later use or processed for outputting a copy of the original document. Sensor bar 10 is formed from a plurality of generally rectangular substrates or chips separated by sawing or other suitable means from one or more circular silicon wafers (not shown). Chips may be assembled in the staggered relationship or butted end to end to form a sensor bar 10 of desired length.

Where a plurality of chips are arranged in end to end relation, the chips, following alignment with one another, are joined together by suitable means to provide a sensor bar 10 of desired length.

The sensor chips are made with standard CMOS process and the addition of the anisotropic V-groove etch.

Figure 3:
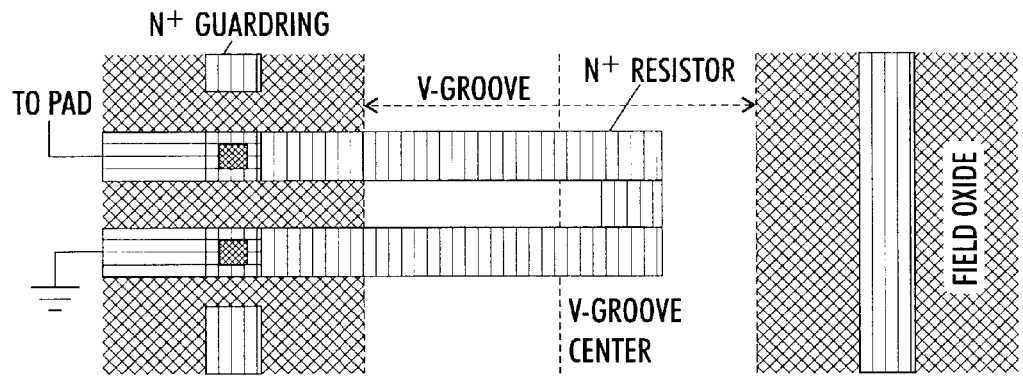
FIGS. 3 and 4 illustrate top down views of alternative embodiments of FIG. 2.
Figure 4:
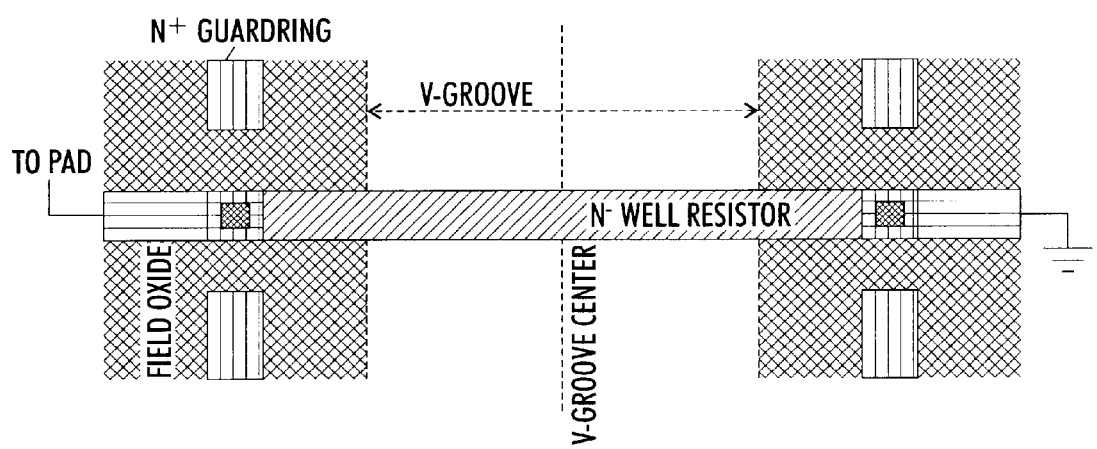
Figure 5:
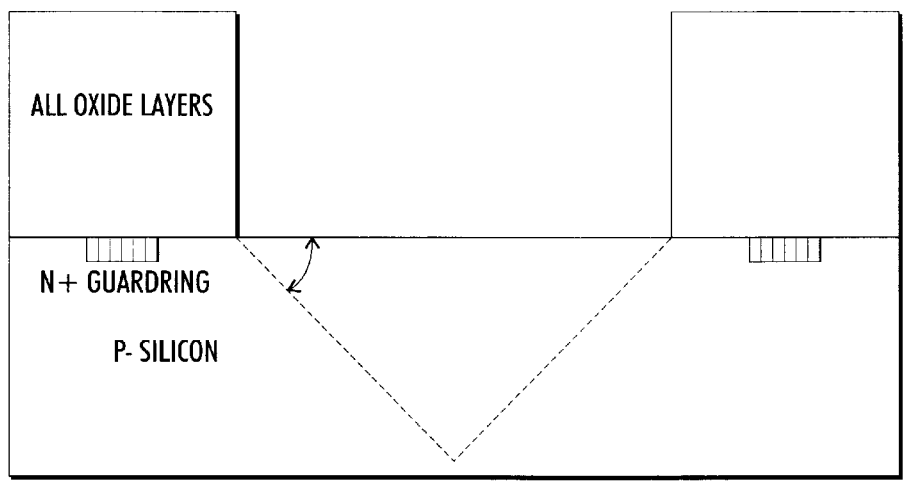
FIG. 5 illustrates a well-formed V-groove cross-section for the prior art layout.
Figure 6:
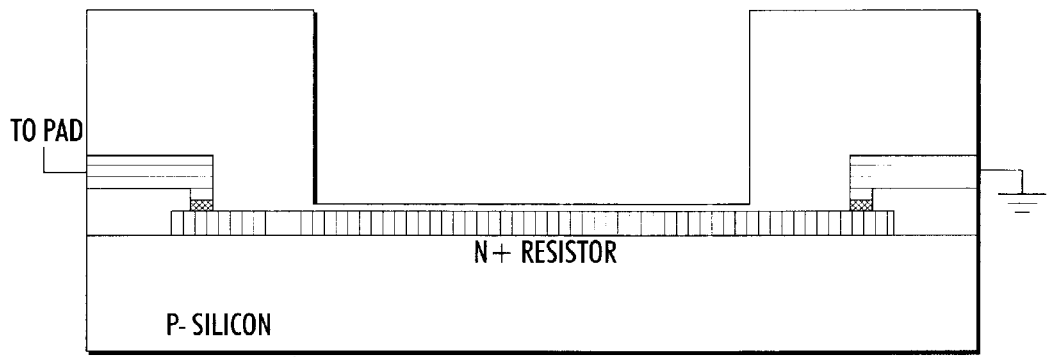
FIGS. 6 and 7 illustrate a resistant path that is formed in the V-groove incorporating the inventive features of the present invention.
Figure 7:
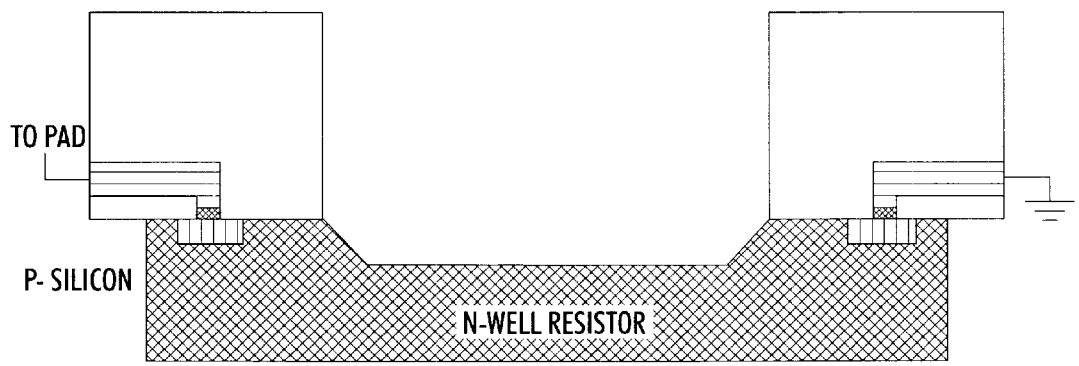

Reference is now made to FIGS. 1 through 7 where the showings are for the purpose of illustrating a preferred embodiment of the invention and not for limiting the same. During the fabrication process, a proper V-groove is formed when the oxide stack is etched down to the silicon and the silicon is etched by an anisotropic etch along the 111 planes until the 111 planes meet at the bottom "V" of the V-groove (FIG. 5). The most common problem that prevents a missing V-groove is the incomplete removal of the oxide above the silicon, which prevents the V-groove etch from working at all (FIG. 6). A diffusion or implanted resistor is laid out to run through the V-groove region, and the resistor is used to detect for incomplete or missing V-groove.

One end of resistor is connected to a pad for electrical test. The other end of the resistor is connected to a pad or power supply or ground. If the V-groove etches through the resistor, this electrical path will show up as an "open" during DC test. If the V-groove is missing (FIG. 6) or incomplete (FIG. 7), there will be a resistive path detected.

FIGS. 2&6 and 4&7 show how the n-type semiconductor resistor passes through the p-silicon region where the V-groove will be formed. The deeper (about 2 um) n-well resistor will better detect an incomplete V-groove (FIG. 7), whereas the shallower (about 0.3 um) n+ resistor will basically only check if the V-groove is totally missing (FIG. 6). It should be evident that the n+ and n− resistors can be used in separate electrical circuits, or in parallel in the same circuit, to detect if the V-groove is missing or incomplete. The amount of resistance measured will indicate how deep the V-groove is etched, up to the point that the V-groove is etched deep enough to completely open up the deepest resistor. The n+ resistor can be placed right on top of the n− well resistor to minimize layout area.

Figure 1:
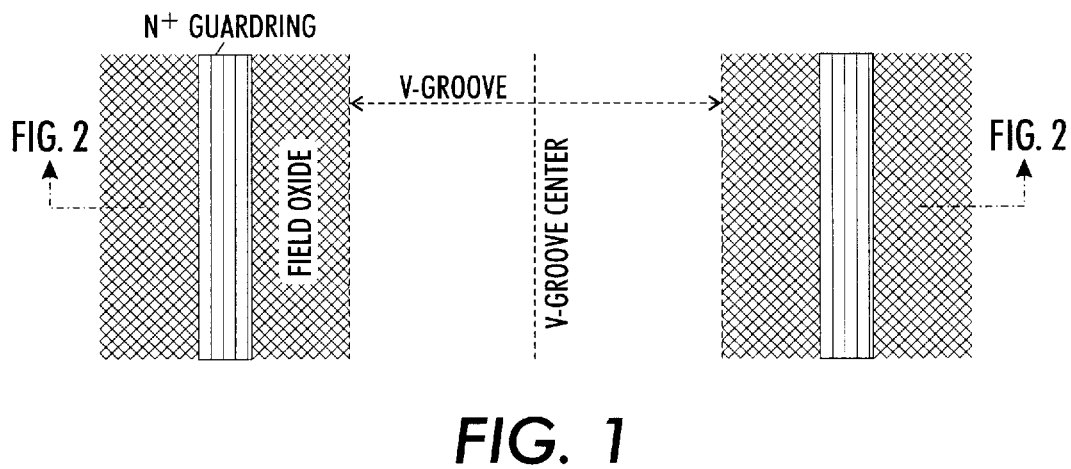
FIG. 1 illustrates a top down view, or physical layout of the prior art.
Figure 2:
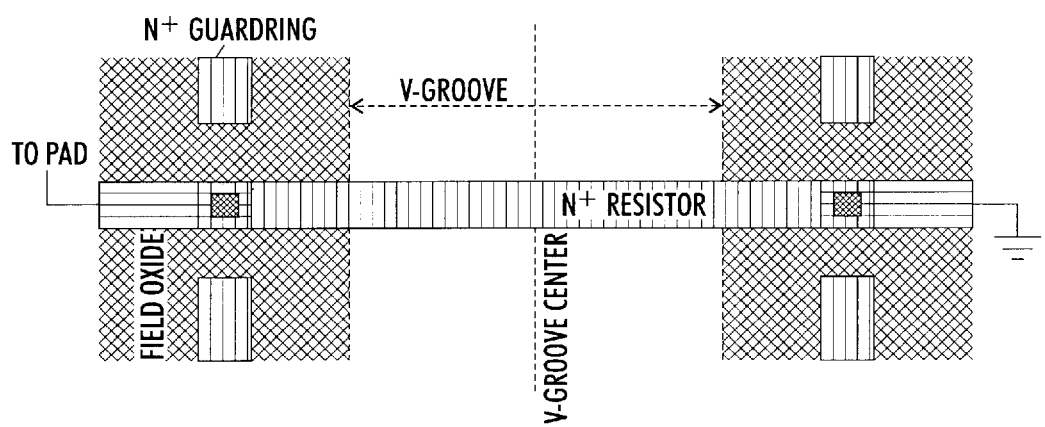
FIG. 2 illustrates a top down view or physical layout of one embodiment of the present invention.
Figure 8:
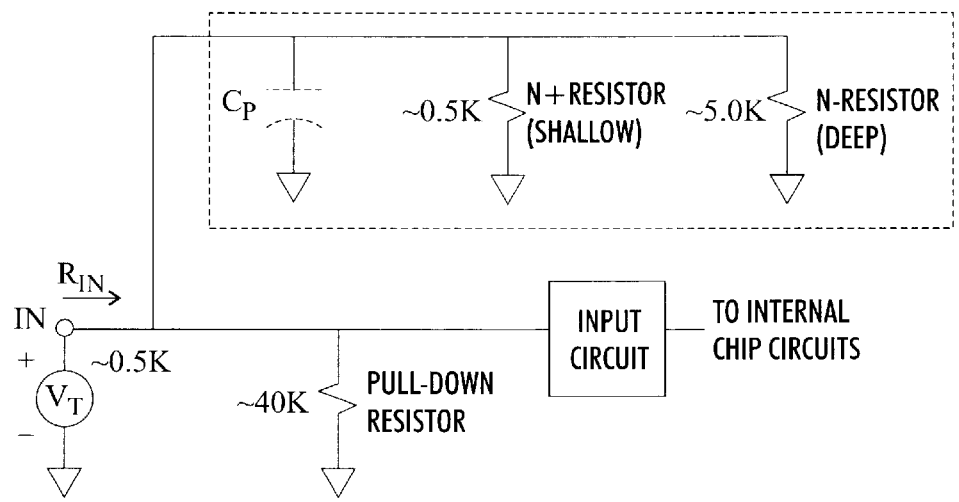
FIG. 8 is an electrical monitor equivalent circuit of FIG. 1 input circuitry plus the addition of the V-groove monitor resistors of FIG. 2 or 3 and FIG. 4.

The resistors of FIGS. 2–4 connected to a pad as shown in electrical equivalent FIG. 8. As noted in FIG. 8, the V-groove resistors can be designed so that the input can still be checked for an open or missing resistor, a short, and also for missing or incomplete V-grooves. For example, when Vt is applied during the test: Rin>80K indicates that missing pull-down resistor- good V-groove; 80K>Rin>20K which indicate a good V-groove: 20k>Rin>2K indicates incomplete V-groove; 2.0K>Rin>0.2K indicates missing V-groove; 0.2kRin>0.0K indicates input short.

The V-groove monitor resistors can also be connected between any two pads, including power and gnd.

Figure 9:
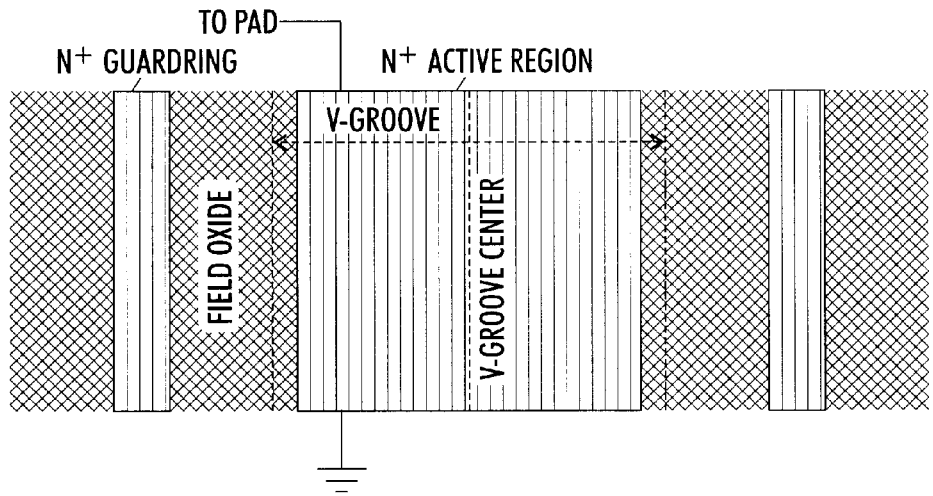
FIGS. 9 and 10 show a couple of possible layouts to check the entire length of the V-groove for missing or incomplete V-groove.
Figure 10:
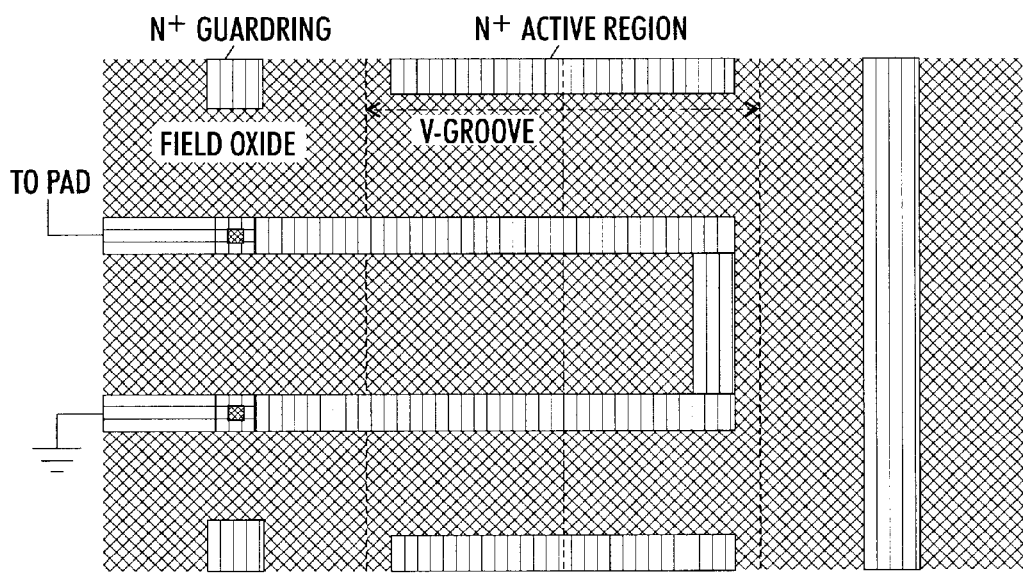

FIGS. 9 and 10 show a couple of possible layouts to check the entire length of the V-groove for missing or incomplete V-groove. If the V-groove monitor resistor can be merged with the guardring diffusion, or if the guardring is not needed, then the layout of FIG. 10 is possible. If a separate guardring diffusion area is needed, the layout of FIG. 9 can be used to check the entire length of the V-groove. Again, there are many variations of these layouts possible, including the combination of shallow and deep V-groove resistor diffusions/implants. Of course, the complimentary doping combinations are also possible, such as a p+ resistor on n− epitaxial wafers. It should also be noted that repeating the structures of 2 or 3 at each end of the V-groove will give a good idea if the whole V-groove in between is etched properly.

There are some other minor considerations in the design of the V-groove monitor resistors. One concern is that the etching of the oxide stack down to the silicon surface will be different in the resistor area due to the combined presence of field oxide and active area. If this is a concern, the entire V-groove area can be made an n+ active area, with the exception of the n+ resistor being defined by a p+ mask (to isolate the n+ resistor in p-epitaxial wafers). This design eliminates all field oxide. There are also some minor concerns that need to be considered such as the stray capacitance, $C_P$, added by the V-groove resistors and the connection to them.

While the present invention has been illustrated for fabrication of a sensor array chip, it should be evident that the present invention can be utilized in any chip fabrication in which it is desired to have buttable chips.

In recapitulation, there has been provided a method of fabricating and a wafer having a plurality of photosensor arrays thereon. And, a method of testing the wafer before the wafer is diced and assembled to form a photosensor array which may be combined with other like photosensor arrays to form a full page width image sensing bar. The invention allows checking of every V-groove on every chip. An implanted or diffused region is placed across the V-groove, with electrical connections on both ends of the diffusion. If the V-groove is formed the diffused region will be broken and the electrical path will be open. A deeper diffusion can be also used to check for incomplete V-grooves. If one end of the electrical path is tied to an existing I/O pad on the chip and the other end to ground, this path will have no effect on the input resistance if the V-groove is formed. There will be a small, but acceptable, increase in input capacitance. If the V-groove is not formed, the connection will appear as a short or high leakage on the chip input, which will fail the DC test on that I/O. Thus, existing DC tests can be used to check normal I/O integrity and V-groove process completion.

We claim:

1. A method for determining a condition of a V-groove on a wafer having a circuit structure thereon before the wafer is processed, cut and assembled, comprising: defining a V-groove region along the wafer;

fabricating a circuit structure on the wafer; said fabricating including applying a test resistor along the V-groove region for evaluating the condition of said V-groove region;

measuring a resistance value of said test resistor after said fabricating and etching of said V-groove region;

comparing said resistance value to a predefined value to determine the condition of said V-groove region.

2. The method of claim 1, wherein said defining step includes the step of orientating along a <111> plane of said wafer.

3. The method of claim 1, wherein said applying step includes step of implanting said test resistor.

4. The method of claim 1, wherein said applying step includes step of diffusing said test resistor.

5. The method of claim 1, wherein said fabricating step forms the circuit structure having a plurality of layers on the wafer.

6. The method of claim 5, wherein one or more test resistors are positioned between one or more of said plurality of layers on the wafer.

7. The method of claim 5, wherein test resistors of different depths into the silicon are positioned between one or more of said plurality of layers on the wafer.

8. The method of claim 1, wherein said applying step includes step crossing said test resistor over a portion of said V-groove.

9. The method of claim 1, wherein said comparing step includes connecting said test resistor to one or more signal or test pads.

10. The method of claim 1, wherein said comparing step includes connecting said test resistor circuitry that is connected to one or more signal or test pads.

11. A method for determining a condition of a V-groove in an image sensor array wafer are fully open before the wafer is processed, cut and assembled, comprising: defining a V-groove region along the wafer;

fabricating a photosensor array structure on the wafer; said fabricating including applying a test resistor along the V-groove region for evaluating the condition of said V-groove region;

measuring a resistance value of said test resistor after said fabricating and etching of said V-groove region; and comparing said resistance value to a predefined value to determine the condition of said V-groove region.

* * * * *